United States Patent
Pendse (10) Patent No.: US 7,367,489 B2
(45) Date of Patent: May 6, 2008

(54) METHOD AND APPARATUS FOR FLIP CHIP ATTACHMENT BY POST COLLAPSE RE-MELT AND RE-SOLIDIFICATION OF BUMPS

(75) Inventor: Rajendra D. Pendse, Fremont, CA (US)

(73) Assignee: ChipPAC, Inc., Fremont, CA (US)

( * ) Notice: Subject to any disclaimer, the term of this patent is extended or adjusted under 35 U.S.C. 154(b) by 103 days.

(21) Appl. No.: 10/882,078

(22) Filed: Jun. 30, 2004

(65) Prior Publication Data

US 2005/0023327 A1 Feb. 3, 2005

Related U.S. Application Data

(60) Provisional application No. 60/484,047, filed on Jul. 1, 2003.

(51) Int. Cl.
*B23K 31/02* (2006.01)
(52) U.S. Cl. ............... 228/180.22; 228/200; 228/233.2
(58) Field of Classification Search ........... 228/180.22, 228/248.1, 215
See application file for complete search history.

(56) References Cited

U.S. PATENT DOCUMENTS

| | | | |
|---|---|---|---|
| 5,203,075 A | 4/1993 | Angulas et al. | |
| 5,232,145 A * | 8/1993 | Alley et al. | 228/102 |
| 5,269,453 A * | 12/1993 | Melton et al. | 228/180.22 |
| 5,477,933 A | 12/1995 | Nguyen | |
| 5,551,627 A | 9/1996 | Leicht et al. | |
| 5,775,569 A * | 7/1998 | Berger et al. | 228/254 |
| 5,796,591 A * | 8/1998 | Dalal et al. | 361/779 |
| 5,894,984 A * | 4/1999 | Sakai et al. | 228/180.22 |
| 5,971,249 A * | 10/1999 | Berkin | 228/102 |
| 6,133,633 A * | 10/2000 | Berger et al. | 257/737 |
| 6,168,064 B1 * | 1/2001 | Berkin | 228/9 |
| 6,281,106 B1 * | 8/2001 | Higdon et al. | 438/613 |
| 6,324,754 B1 * | 12/2001 | DiStefano et al. | 29/840 |
| 6,465,747 B2 * | 10/2002 | DiStefano et al. | 174/261 |
| 6,501,051 B1 * | 12/2002 | Richert et al. | 219/388 |
| 6,893,799 B2 * | 5/2005 | Danovitch et al. | 430/311 |
| 2002/0029902 A1 * | 3/2002 | DiStefano et al. | 174/260 |

* cited by examiner

*Primary Examiner*—Kiley Stoner
(74) *Attorney, Agent, or Firm*—Robert D. Atkins; Quarles & Brady LLP (57) ABSTRACT

A solder bump reflow process includes raising the temperature of an aligned die-substrate assembly to a temperature and for a time sufficient to cause a first reflow; allowing the temperature of the assembly to fall to a first cooling temperature and for a time sufficient to re-solidify the solder; raising the temperature of the die-substrate assembly a second time to a temperature and for a time sufficient to cause a second reflow; allowing the temperature of the assembly to fall a second time to a second cooling temperature and eventually to an ambient room temperature; in which at least the first and second melts and the first re-solidification are conducted without exposing the assembly to oxidizing atmosphere. Also, apparatus for carrying out the method includes a multi-zone oven.

25 Claims, 3 Drawing Sheets

METHOD AND APPARATUS FOR FLIP CHIP ATTACHMENT BY POST COLLAPSE RE-MELT AND RE-SOLIDIFICATION OF BUMPS

CROSS REFERENCE TO RELATED APPLICATION

This application is related to, and claims the benefit of, U.S. Provisional Application No. 60/484,047, which was filed Jul. 1, 2003.

BACKGROUND

This invention relates to semiconductor packaging and, particularly, to attachment of semiconductor die to substrates by solder reflow.

Flip chip attachment of a die to a substrate is a common interconnection technique, in which solder bumps attached to an active surface of the die are reflowed onto matching interconnect pads on a surface of the substrate. In a solder reflow process conventionally used to form the interconnection, the die is aligned with and placed on the substrate with the solder bumps apposed to their respective pads, and the die-substrate assembly is passed through a reflow oven which heats the assembly and then allows it to cool, to melt and then solidify the bumps onto the pads. In a conventional reflow oven, the assemblies are conveyed from one end of the oven to the other through a series of zones. Heating elements in the various zones can be independently activated and controlled to raise and then lower the temperature of the assembly as it passes on the conveyor through the oven. Typically in a solder bump reflow process, the temperature of the assembly is ramped up from an ambient room temperature by heaters in the earlier zones to near the melting point of the solder, then the temperature is raised to above the solder melting point and there held for a time sufficient to allow reflow of the bumps onto the pads, and finally the temperature is allowed to fall past the solder melting point (permitting the solder to solidify on the pads) and back down to an ambient room temperature.

Some number of interconnects made according to this conventional process include poor or marginally adequate connections, which may number in the range of a few hundred defective joints per million.

It may be possible to repair failed interconnects in defective assemblies by passing the defective assemblies a second time through a reflow oven to repeat the solder reflow process, and such an approach has been proposed. This approach is impracticable for number of reasons. Particularly, oxidation of the solder can occur following removal of the assemblies from the oven, and the oxides can interfere with subsequent formation of a good connection. Also, repetition of the reflow process significantly increases (and may at least double) the time and processing resources that must be expended to achieve attachment of the initially defective assemblies.

It is desirable therefore to improve production yield by reducing the occurrence rate of defective or marginal connections during the solder bump reflow process, without significantly increasing the budget of time and resources.

SUMMARY

This invention is directed to flip chip interconnection by reflow of solder bumps on the semiconductor die onto interconnect pads on a substrate. According to the invention significant improvement in process yield of good interconnect joints can be achieved by placing the die-substrate assembly into a reflow oven, conducting a first solder melt/reflow and a first re-solidification, and then, before removing the assembly from the oven, conducting a second solder melt/reflow and a second re-solidification.

In one general aspect of the invention, a solder bump reflow process includes raising the temperature of an aligned die-substrate assembly to a temperature above the melting temperature (or, for a eutectic solder composition, above the eutectic temperature) and for a time sufficient to cause a first reflow; allowing the temperature of the assembly to fall below the melting temperature (or eutectic temperature) to a first cooling temperature and for a time sufficient to re-solidify the solder; raising the temperature of the die-substrate assembly a second time to a temperature above the melting temperature (or eutectic temperature) and for a time sufficient to cause a second reflow; allowing the temperature of the assembly to fall a second time below the melting temperature (or eutectic temperature) to a second cooling temperature and eventually to an ambient room temperature; in which at least the first and second melts and the first re-solidification are conducted without exposing the assembly to oxidizing atmosphere.

In another general aspect the invention features a method for forming a flip chip interconnection of a die aligned with a substrate, by placing the die-substrate assembly in an oven, raising the temperature of the assembly to a temperature above the melting temperature (or the eutectic temperature) and for a time sufficient to cause a first reflow; allowing the temperature of the assembly to fall below the melting temperature (or eutectic temperature) to a first cooling temperature and for a time sufficient to re-solidify the solder; then, without removing the once-melted and once-re-solidified assembly from the oven, raising the temperature of the die-substrate assembly a second time to a temperature above the melting temperature (or eutectic temperature) and for a time sufficient to cause a second reflow; allowing the temperature of the assembly to fall a second time below the melting temperature (or eutectic temperature) to a second cooling temperature and eventually to an ambient room temperature; and removing the twice-melted and twice-re-solidified assembly from the oven.

In some embodiments the oven is a multi-zone oven, provided with a conveyer operative to move the assembly from an input to an output of the oven, and the step of placing the assembly in the oven includes placing it on the conveyor.

In some embodiments the first cooling temperature is below the solder bump melting temperature (or eutectic temperature) and in a range between the melting temperature and about 50° C. less than the melting temperature. As will be apparent, the first cooling temperature must necessarily be below the melting temperature in order for the solder to re-solidify. The lower limit is determined by the extent of the collapse of the die toward the substrate.

In some embodiments the solder bump includes a high-lead solder (having a comparatively higher melting temperature, such as lead-tin solder greater than 95% lead), or a lead-free solder (having a comparatively lower melting temperature), or a eutectic solder composition (such as a tin-lead eutectic, e.g., 63% Sn/37% Pb); in some embodiments the solder bump is a composite bump including a base portion and a top (pad contact) portion, in which the top portion has a lower melting temperature (or eutectic temperature) than the base portion.

In another aspect the invention features apparatus for forming a flip chip interconnection, including a multi-zone oven, wherein a first region (which may include more than one zone) is set to raise the temperature of the assembly to a temperature above the melting temperature (or the eutectic temperature) and for a time sufficient to cause a first solder bump reflow, a second region (which may include more than one zone) is set to allow the temperature of the assembly to fall below the melting temperature (or eutectic temperature) to a first cooling temperature and for a time sufficient to re-solidify the solder, and a third region (which may include more than one zone) set to allow the temperature of the assembly to fall a second time below the melting temperature (or eutectic temperature) to a second cooling temperature; the oven having an input and an output and a conveyor operative to move an aligned die-substrate assembly from the input through the first region, the second region, and the third region, to the output. The settings for the various regions (zones) are determined according to the melting temperature (or eutectic temperature) and melting time for the particular solder composition that forms the interconnects of the bumps and the pads in the assembly that is being processed.

DETAILED DESCRIPTION

The invention will now be described in further detail by reference to the drawings, which illustrate alternative embodiments of the invention.

Figure 1:
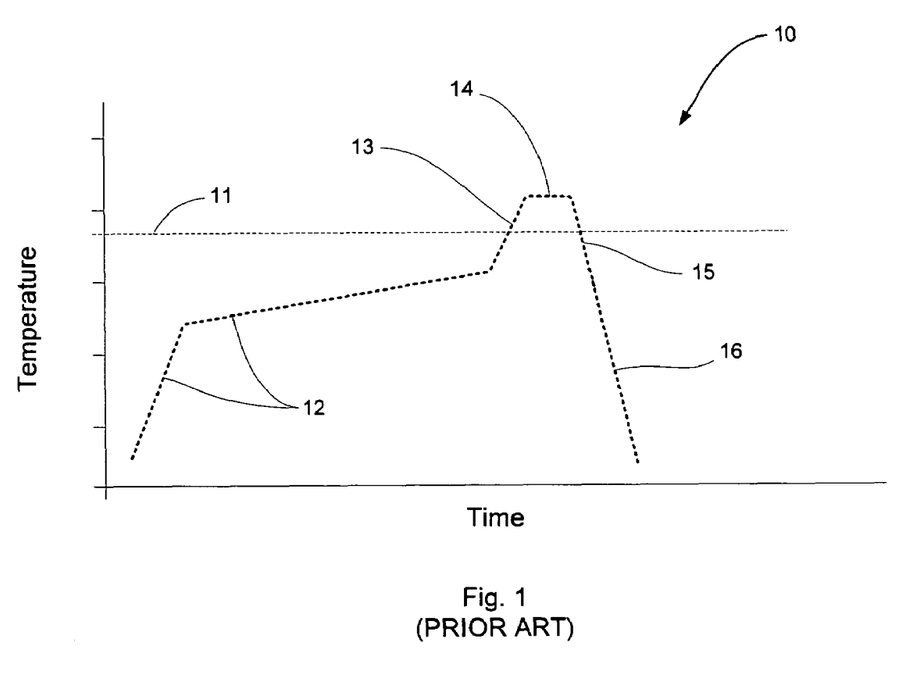
FIG. 1 is a diagrammatic sketch showing a conventional reflow process temperature profile.

Turning now to FIG. 1, an idealized conventional reflow process temperature profile is shown generally at 10, for a process (by way of example) in which the solder is a eutectic material. In the reflow process profile, processing time runs from left to right, and generally corresponds to the movement of the apparatus through the zones of the oven. Because in this example the solder is a eutectic material the liquidus point and the solidus point of the solder are the same, and are referred to as the melting temperature, indicated in the profile at 11.

As noted above in background, in a conventional solder bump reflow process the assembly is placed on the conveyor on the input end of the oven; the temperature of the assembly is ramped up, as shown in the profile at 12, from an ambient room temperature by heaters as it is conveyed through the earlier zones to near the melting point 11 of the solder. The ramp-up 12 may be done in stages, as suggested in the profile 10, by an earlier rapid heating stage followed by a more gradual heating stage. Then the temperature is raised, as shown in the profile at 13, to above the solder melting point, and held at a temperature above the solder melting point, as shown in the profile at 14, for a time sufficient to allow reflow of the bumps onto the pads. Then the assembly is allowed to cool, as shown in the profile at 15, below the solder melting point (permitting the solder to re-solidify on the pads) and, as shown in the profile at 16, back down to a near ambient room temperature. The completed assembly is then removed from the conveyor at the output end of the oven, and tested for subsequent treatment.

Figure 2:
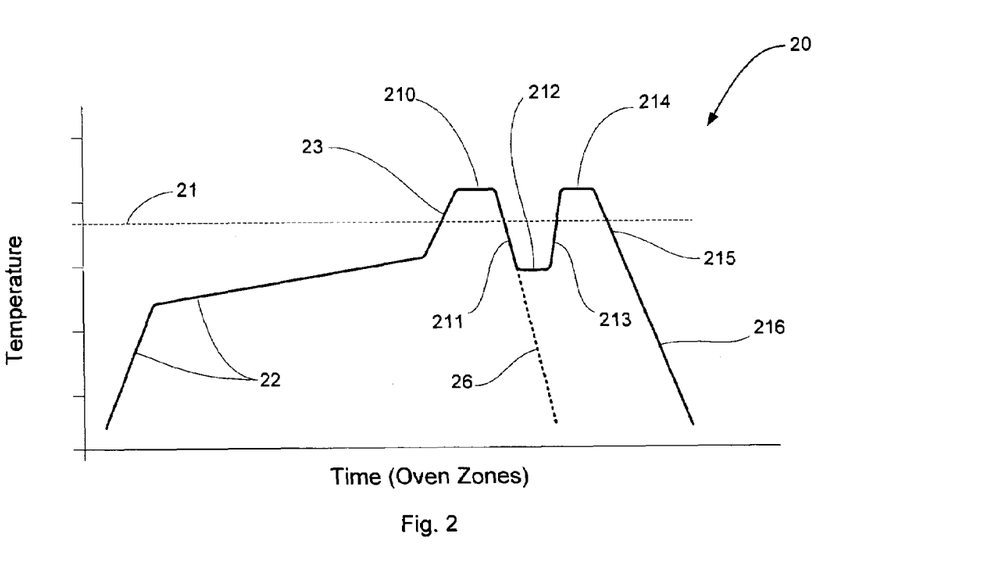
FIG. 2 is a diagrammatic sketch comparing an idealized reflow process temperature profile according to the invention with a conventional reflow process profile.

FIG. 2 shows an idealized reflow process temperature profile according to the invention is shown generally at 20 (solid line) superimposed upon a conventional reflow process profile (shown in part by a broken line). As in FIG. 1, the idealized process profiles shown in FIG. 2 are for a process in which the solder is a eutectic material, so that the liquidus temperature and the solidus temperature are the same, and are referred to as the melting point, indicted in the profile at 21. processing time runs from left to right, and generally corresponds to the movement of the apparatus through the zones of the oven.

According to the invention, a first part of the interconnect process proceeds generally as a conventional solder bump reflow process, up to the point where the assembly is allowed to cool past the solder melting point. That is, the assembly is placed on the conveyor on the input end of the oven; the temperature of the assembly is ramped up, as shown in the profile at 22, from an ambient room temperature by heaters as it is conveyed through the earlier zones to near the melting point 21 of the solder. The ramp-up 22 may be done in stages, as suggested in the profile 20, by an earlier rapid heating stage followed by a more gradual heating stage. Then the temperature is raised, as shown in the profile at 23, to above the solder melting point, and held at a temperature above the solder melting point, as shown in the profile at 210, for a time sufficient to allow a first reflow of the bumps onto the pads. Then the assembly is allowed to cool, as shown in the profile at 211, to a temperature below the solder melting point, and held at a temperature below the melting point, as shown in the profile at 212, for a time sufficient to permit a first re-solidification of the solder on the pads. Then the temperature of the assembly is again raised, as shown in the profile at 213, to above the solder melting point, and held at a temperature above the solder melting point, as shown in the profile at 214, for a time sufficient to allow a second reflow of the bumps. Then the assembly is allowed to cool, as shown in the profile at 215, below the solder melting point (permitting the solder to re-solidify on the pads) and, as shown in the profile at 216, back down to a near ambient room temperature. The completed assembly is then removed from the conveyor at the output end of the oven, and tested for subsequent treatment.

Thus, in the interconnect process of the invention, a first melt and re-solidification of the solder bumps is followed by a second melt and a second re-solidification. Without intending to be bound thereby, it appears that events in the assembly during the course of the Interconnect process of the invention are as follows. Apparently, immediately after the first melt, a majority of the interconnections are formed, and the chip "collapses" toward the substrate as a result of the flow of solder on the substrate pads. The gap between the chip and the substrate may narrow further as the solder cools and undergoes a thermal contraction. At this stage some marginal or open connections may exist, and, in a conventional process these defects would be present in the finished product. The second melt occurs after the collapse of the chip, and the bump and pad in any marginal connection are in contact, or at least in close proximity to one another. Accordingly, during the second melt and re-solidification any such marginal connections are re-formed as good connections. Apparently, there is comparatively little collapse of the chip toward the substrate during the second melt; there appears to be a threshold for collapse, owing possibly to effects of solder surface tension and/or wettability of the pads, and the threshold is apparently reached or nearly reached during the first melt. Because the second melt and re-solidification are carried out in the same reflow oven as the first melt and re-solidification, the mating surfaces are not exposed to atmosphere outside the oven, so that oxidation or other contamination of the mating surfaces is avoided.

Preferably, the first cooling temperature (at 212 in FIG. 2) to which the assembly is allowed to drop following the first melt and preceding the second melt is within a limited range Tc below the melting temperature (or the eutectic temperature), and this range is between the melting temperature (indicated at 21 in FIG. 2) and about 50° C. less than the melting temperature. As will be apparent, the first cooling temperature must necessarily be below the eutectic temperature (or, for a non-eutectic solder, the solidus temperature) of the bump in order for the solder to re-solidify. The lower limit of the range for the first cooling temperature is determined according to the extent of the collapse of the die toward the substrate. It is desirable that any bumps and pads that are poorly or marginally connected following the first re-solidification be brought into contact, or into as close proximity as practicable, so that the second reflow can form an effective joint between them. As noted above, during die collapse the gap narrows between the die and the substrate in part as a consequence of thermal contraction of the re bump material during the first cooling. For example, where the interconnect solder bumps have a eutectic composition characterized by a eutectic liquid phase temperature about 183° C., the first cooling temperature is preferably within a range Tc below 183° C. and above about 133° C.

To achieve the temperature profile of the invention, a reflow oven having multiple zones, and preferably having a minimum of 8 zones, is used. This allows the first part of the process, which includes the first melt phase, to be generally similar to a conventional solder bump reflow profile, as described above with reference to FIG. 1, up to and including the first melt. Such conventional reflow profiles are typically achieved in reflow ovens having 5 to 7 zones. The profile according to the invention may employ 1 or 2 or more additional zones for optimum results. Reflow ovens are commercially available from industry suppliers such as, for example, BTU International, Inc. and Heller Industries, Inc. The operation of these ovens is well known. Some models are modularly constructed, and any of various types of zones can be added as required. Accordingly, at least some models can be readily adapted for generating the temperature profiles according to the invention. Reflow ovens conventionally are equipped for control of the chamber atmosphere, and a multistage reflow oven for use according to the invention will preferably be equipped to maintain a "clean" (at least non-oxidative) atmosphere during both of the melts and the re-solidifications. According to the invention, the zones may be set (programmed or operated) in three zonal regions: a first region (typically more than one zone) in which the ramp up and first melt are carried out; a second region (which may include one or more zones) in which the first re-solidification is carried out; and a third region (which may include one or more zones) in which the second re-solidification is carried out. The various zones within the regions are operated (or set, or programmed for automated operation) to provide the required temperature profile according to the melt temperature and time characteristics of the particular bump composition, as described above.

Figure 4A:
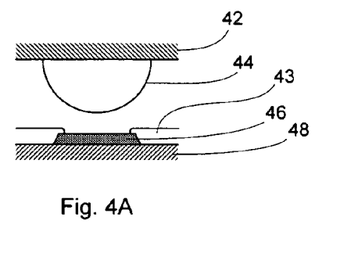
FIGS. 4A through 4D are sketches in a sectional view showing stages in formation of a flip chip interconnection according to an aspect of the invention.
Figure 4B:
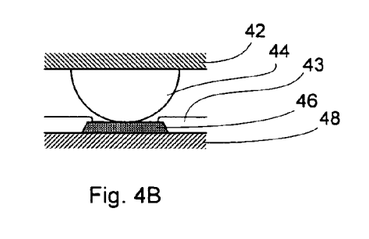
Figure 4C:
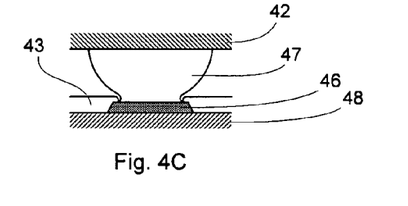
Figure 4D:
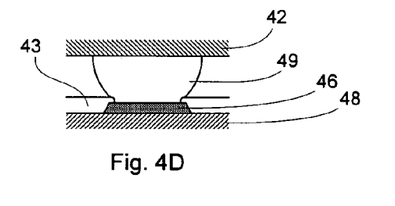

Stages of such a process according to the invention are shown diagrammatically in FIGS. 4A through 4D. In these FIGS., there are shown an interconnect solder ball or bump 44 attached onto an interconnect pad on a semiconductor integrated circuit die 42, and an interconnect site 46 on a substrate 48. In the example shown in the FIGS., the interconnect site is "mask-defined"; that is, a solder mask 43 is provided, patterned to have openings over the interconnect sites (pads or leads), so that the openings define the extent to which the molten solder can run onto the sites. The die and the substrate are apposed so that the ball 44 is aligned with the corresponding interconnect site 46, as shown in FIG. 4A. The aligned die and substrate are moved toward each other so that the ball contacts the site, as shown in FIG. 4B. Then the temperature of the assembly is raised to a temperature above the liquidus point (or melting temperature) of the solder, and held above the liquidus temperature for a time sufficient to melt the solder. The mating surface of the interconnect site is "wetted" by the molten solder, as illustrated in FIG. 4C and, in the example illustrated here, an opening in the solder mask 43 limits the extent to which the mating surface can be wetted by the solder. Then the temperature of the assembly is allowed to fall to a temperature below the solidus point (or melting temperature) and held below the solidus temperature for a time sufficient to allow a first re-solidification of the solder. As the solder cools and re-solidifies, some shrinkage of the solder occurs, resulting in the die and substrate drawing more closely together to some extent. Then the temperature of the assembly is again raised to a temperature above the liquidus point (or melting temperature) of the solder, and held above the liquidus temperature for a time sufficient to again melt the solder. Then the temperature of the assembly is allowed to fall to a temperature below the solidus point (or melting temperature), and eventually to near ambient temperature, again re-solidifying the solder, and resulting in a good connection of the ball or bump on the interconnect site as shown in FIG. 4D.

In other embodiments of the invention, the interconnect sites on the substrate may be non-mask defined; that is, no solder mask is employed to limit the flow of solder on the interconnect sites (pads or leads) 46. In non-mask defined interconnects, the molten solder can run over any solder wettable surface it contacts, and in such interconnects the solder may be expected to flow over the edges of the interconnect sites (pads or leads) 46 and down the sides toward the substrate 48, which is typically not solder wettable.

Semiconductor die typically have a very large number of balls or bumps which must make a robust electrically conductive connection with a corresponding large number of sites on the substrate circuitry. Deviations from planarity in the die or the substrate can result in inadequate interconnection. Particularly, the die attach side of a substrate is typically non-planar to some extent. As a result, when the die and substrate are brought together to contact the balls with the sites (FIGS. 4A, 4B) one or more of the balls may not make a good contact with their corresponding interconnect sites. Re-flow of the solder onto the mating surface of the site may not occur, so that fusing of the solder with the mating surface of the site following a melt and re-solidification can be insufficient to make a good and robust electrical connection. According to the invention, however, the number of failed connections is reduced by the additional re-melt and re-solidification. Apparently, as the die and substrate come closer together during the first re-solidification, those bumps that made no contact with their respective sites prior to the first re-melt are brought into better contact with their respective sites during the first re-solidification, so that they are more likely to form a good and robust electrical connection during the second re-melt and re-solidification.

Figure 3:
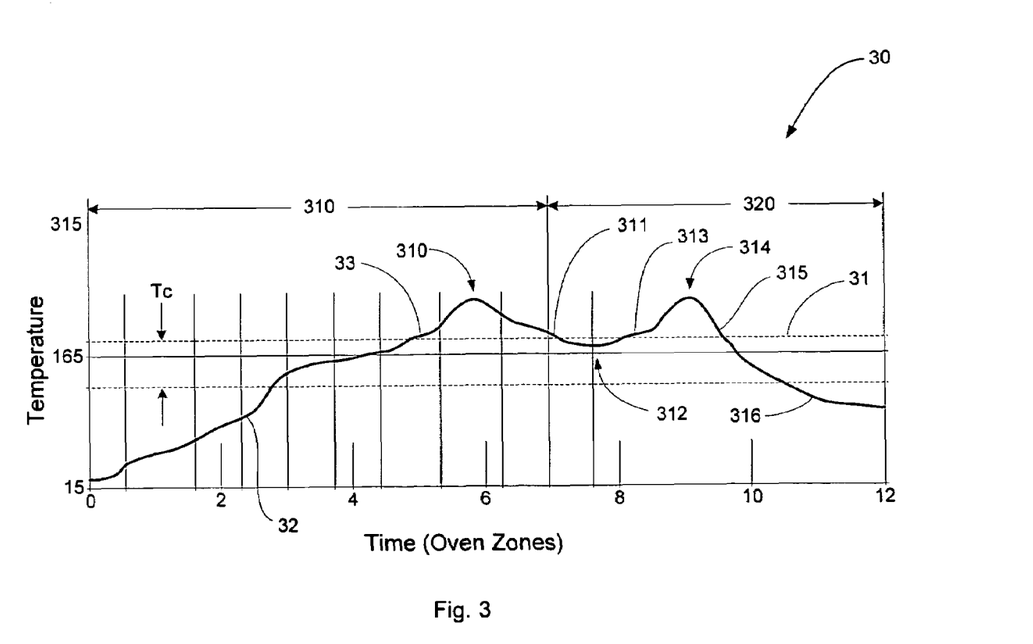
FIG. 3 is a plot of a reflow process temperature profile according to one example of the invention, as measured by a thermocouple traversing a ten-zone reflow oven.

An example of a reflow process temperature profile 30 according to the invention, recorded by a thermocouple traversing a 10-zone reflow oven is shown in FIG. 3. This profile was designed for reflow of solder bumps having a tin-lead eutectic composition (63% Sn/37% Pb) which has a eutectic liquid phase temperature of 183° C. Accordingly, a first part of the process 310 resembles a conventional profile for such a composition, in which a melt in the first part of the process is brought about by a first temperature "hump" 310 in the profile, which exceeds the 183° C. eutectic temperature. A second part 320 of the process includes a second (post-collapse) melt, which is brought about by a second "hump" 314 in the profile, which also exceeds the 183° C. eutectic temperature. Between the first melt and the second melt is a first re-solidification stage 312, at a temperature (here ~170° C.; preferably in the range Tc below 183° C. and above about 133° C. for this solder composition). In this particular example, the temperature maximum (peak) for the melts 310, 320 was at 227.8° C., and the temperature of the assembly was above 183° C. for a total time (sum of both humps) of 224.28 seconds.

Referring still to FIG. 3, the assembly is placed on the conveyor on the input end of the oven; the temperature of the assembly is ramped up, as shown in the profile at 32, from an ambient room temperature by heaters as it is conveyed through the earlier zones to near the melting point 31 of the solder. The ramp-up 32 may be more or less constant, or may be carried out at varying rates, as suggested in the profile 32, by varying the effective heating at successive stages in the oven. Then the temperature is raised, as shown in the profile at 33, to above the solder melting point 31, and held at a temperature above the solder melting point, as shown by the "hump" in the profile at 310, for a time sufficient to allow a first reflow of the bumps onto the pads. Then the assembly is allowed to cool, as shown in the profile at 311, to a temperature below the solder melting point 31, and held at a temperature below the melting point, as shown in the profile at 312, for a time sufficient to permit a first re-solidification of the solder on the pads. Then the temperature of the assembly is again raised, as shown in the profile at 313, to above the solder melting point 31, and held at a temperature above the solder melting point, as shown by the "hump" in the profile at 314, for a time sufficient to allow a second reflow of the bumps. Then the assembly is allowed to cool, as shown in the profile at 315, below the solder melting point 31 (permitting the solder to re-solidify on the pads) and, as shown in the profile at 316, back down to a near ambient room temperature. The completed assembly is then removed from the conveyor at the output end of the oven, and tested for subsequent treatment.

As noted above, the example illustrated in FIG. 3 is for a eutectic bump composition. The invention can be used for interconnection of other solder bump compositions as well. The configuration (height; duration) of the humps in the profile and the range Tc can be determined generally according to the particular solder melting temperature (liquidus and solidus temperatures) and melt times, which may be known or readily ascertainable for the particular composition. Other solder bump compositions include other eutectic compositions; lower lead compositions which typically have lower melting temperatures; higher lead compositions which typically have higher melting temperatures; and composite bump structures, having a higher melting temperature base portion and a lower melting temperature top (contact) portion.

High lead bump compositions in common use include, for example, lead-tin solders having greater than 95% Pb (the balance being Sn), having a melting point in the range about 320° C. to 330° C. For such a composition having a melting temperature of 325° C., for example, a preferred temperature profile according to the invention would have temperature humps greater than 325° C., and a first cooling temperature (between the first and second melts) in a range Tc below 325° C. and above about 275° C.

For composite bump structures consisting of a base portion having a higher melting point and a top portion having eutectic solder composition, as are also used in the industry, the configuration of the humps and the first cooling temperature range are determined according to the melting temperature of the eutectic portion of the bump, as being the effective melting point of the bump.

As will be apparent, where the particular solder composition has a liquidus temperature different from the solidus temperature, the temperature must be raised above the liquidus point during segments of the profile in which the temperature is raised to perform the melts, and the temperature must be lowered below the solidus point during solidification and re-solidification segments of the profile.

In some embodiments, in addition to the solder bumps provided on the die, the mating surfaces of the interconnect sites on the substrate may be provided with a small spot of electrically conductive reflowable material (such as a solder). In these embodiments, presuming the first melt temperature is greater than the melting temperature (or eutectic temperature) of the small spots on the substrate, the small spots may "round up" during the first melt. As described above, in some instances the first melt fails to produce reflow between a particular bump on a die and the corresponding rounded up spot on the pad. Even though the die collapse (and shrinkage due to thermal contraction) may bring these respective bumps and spots into contact, a poor or marginally acceptable joint is likely to occur. According to the invention, the second melt can provide for reflow between the bump on the die and the rounded-up spot on the pad, correcting the poor or marginally adequate connection.

Figure 5A:
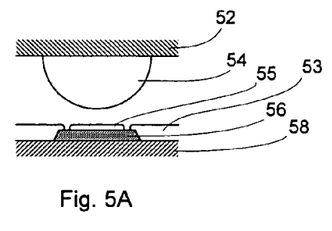
FIGS. 5A through 5D are sketches in a sectional view showing stages in formation of a flip chip interconnection according to an aspect of the invention.
Figure 5B:
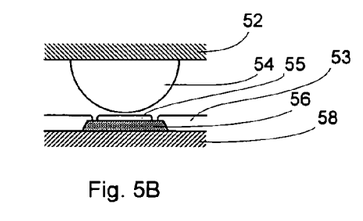
Figure 5C:
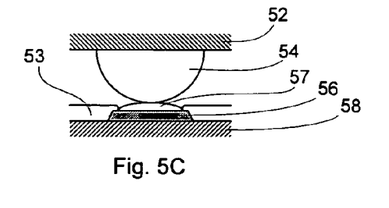
Figure 5D:
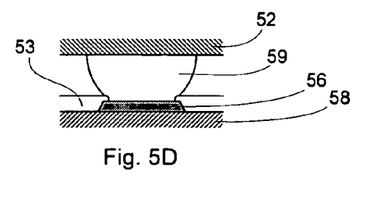

Stages of such a process according to the invention, in which interconnect sites are provided with spots of a reflowable material, are shown diagrammatically in FIGS. 5A through 5D. In these FIGS., there are shown an interconnect solder ball or bump 54 attached onto an interconnect pad on a semiconductor integrated circuit die 52, and an interconnect site 56 on a substrate 58. A spot 55 of reflowable material (such as a solder paste, which may when reflowed and re-solidified provide the same composition as the solder of the bump or ball 54) is provided at the mating surface of the site 56. In the example shown in the FIGS., the interconnect site is "mask-defined"; that is, a solder mask 53 is provided, patterned to have openings over the interconnect sites (pads or leads), so that the openings define the extent to which molten solder can run onto the sites. The die and the substrate are apposed so that the ball 54 is aligned with the corresponding interconnect site 56, as shown in FIG. 5A. The aligned die and substrate are moved toward each other so that the ball contacts the spot on the site, or so that the ball is brought close to the spot on the site. As will be appreciated, when the die, having a large number of balls, is moved toward the substrate so that at least some, and typically nearly all, of the balls contact the spots on their respective sites, one or more of the balls may not make good contact with the spots, as illustrated in FIG. 5B. Then the temperature of the assembly is raised to a temperature above the liquidus point (or melting temperature) of the solder, and held above the liquidus temperature for a time sufficient to melt the solder. As the solder in the spot melts, the spot rounds up, as illustrated in FIG. 5C, improving the contact between the molten ball and the molten spot on the site, or making contact in instances where contact was not made before the first melt (as illustrated in FIG. 5B). The melted spot wets the mating surface of the interconnect site (pad or lead), and the molten solder of the ball and the spot on the site join. In the example illustrated here, an opening in the solder mask 53 limits the extent to which the mating surface can be wetted by the melted solder. Then the temperature of the assembly is allowed to fall to a temperature below the solidus point (or melting temperature) and held below the solidus temperature for a time sufficient to allow a first re-solidification of the solder. As the solder cools and re-solidifies, some shrinkage of the solder occurs, resulting in the die and substrate drawing more closely together to some extent. Then the temperature of the assembly is again raised to a temperature above the liquidus point (or melting temperature) of the solder, and held above the liquidus temperature for a time sufficient to again melt the solder. Then the temperature of the assembly is allowed to fall to a temperature below the solidus point (or melting temperature), and eventually to near ambient temperature, again re-solidifying the solder, and resulting in a good connection of the ball or bump on the interconnect site as shown in FIG. 5D.

In other embodiments of the invention, the interconnect sites on the substrate may be non-mask defined; that is, no solder mask is employed to limit the flow of solder on the interconnect sites (pads or leads) 56. In non-mask defined interconnects, the molten solder can run over any solder wettable surface it contacts, and in such interconnects the solder may be expected to flow over the edges of the interconnect sites (pads or leads) 56 and down the sides toward the substrate 58, which is typically not solder wettable.

Other embodiments are within the following claims.

I claim:

1. A solder bump reflow process, comprising:
providing a die having a plurality of solder bumps and a substrate having a plurality of mating surfaces on interconnect sites, the solder bumps being made with a material having a liquidus temperature and a solidus temperature;
contacting the solder bumps of the die and the mating surfaces of the substrate to form a die-substrate assembly;
placing the die-substrate assembly on a transport mechanism which passes through an oven having a non-oxidizing atmosphere, the oven operating with a plurality of physically separate temperature zones;
passing the die-substrate assembly through the plurality of physically separate temperature zones of the oven, including the steps of,
(a) in a first temperature zone of the oven, raising the die-substrate assembly to a first heating temperature above the liquidus temperature of the solder bumps as the die-substrate assembly passes through the first temperature zone of the oven, and holding the first heating temperature above the liquidus temperature for a time sufficient to cause a first reflow of the solder bumps onto the mating surfaces of the substrate,
(b) in a second temperature zone of the oven, decreasing the die-substrate assembly to a first cooling temperature below the solidus temperature of the solder bumps as the die-substrate assembly passes through the second temperature zone of the oven, and holding the first cooling temperature below the solidus temperature to a first re-solidification of the solder bumps, wherein a number of the solder bumps fail to metallurgically connect to the mating surfaces of the interconnect sites on the substrate during the first reflow and first re-solidification,
(c) in a third temperature zone of the oven, raising the die-substrate assembly to a second heating temperature above the liquidus temperature of the solder bumps as the die-substrate assembly passes through the third temperature zone of the oven, and holding the second heating temperature above the liquidus temperature for a time sufficient to cause a second reflow of the solder bumps onto the mating surfaces of the substrate, and
(d) in a fourth temperature zone of the oven, decreasing the die-substrate assembly to a second cooling temperature below the solidus temperature to a second re-solidification of the solder bumps;
wherein the number of the solder bumps which failed to metallurgically connect to the mating surfaces of the interconnect sites on the substrate during the first reflow and first re-solidification are metallurgically connected during the second reflow and second re-solidification; and
wherein the first and second reflow and the first and second re-solidification steps are conducted as a continuous process in the oven without exposing the die-substrate assembly to an oxidizing atmosphere to avoid contamination of the die-substrate assembly during the solder bump reflow process.

2. The solder bump reflow process of claim 1, wherein the first cooling temperature ranges between the solidus temperature and about 50° C. less than the solidus temperature.

3. The solder bump reflow process of claim 1, wherein the material of the solder bumps includes lead solder.

4. The solder bump reflow process of claim 1, wherein the material of the solder bumps includes lead free solder.

5. The solder bump reflow process of claim 1, wherein the material of the solder bumps includes tin-lead solder.

6. The solder bump reflow process of claim 1, wherein the solder bump material is 63% tin and 37% lead eutectic.

7. The solder bump reflow process of claim 6, wherein the first heating temperature is above 183°°C. and the first cooling temperature is between 183° C. and 133° C.

8. A solder bump reflow process, comprising:
providing a die having a plurality of solder bumps and a substrate having a plurality of mating surfaces on interconnect sites, the solder bumps being made with a material having a liquidus temperature and a solidus temperature;
contacting the solder bumps of the die and the mating surfaces of the substrate to form a die-substrate assembly; and
passing the die-substrate assembly through an oven operating with a plurality of temperature zones in a non-oxidizing atmosphere, including the steps of,
(a) in a first temperature zone of the oven, raising the die-substrate assembly to a first heating temperature above the liquidus temperature of the solder bumps, and holding the first heating temperature above the liquidus temperature to cause a first reflow of the solder bumps onto the mating surfaces of the substrate, (b) in a second temperature zone of the oven, decreasing the die-substrate assembly to a first cooling temperature below the solidus temperature of the solder bumps, and holding the first cooling temperature below the solidus temperature to a first re-solidification of the solder bumps, (c) in a third temperature zone of the oven, raising the die-substrate assembly to a second heating temperature above the liguidus temperature of the solder bumps, and holding the second heating temperature above the liguidus temperature to cause a second reflow of the solder bumps onto the mating surfaces of the substrate, and (d) in a fourth temperature zone of the oven, decreasing the die-substrate assembly to a second cooling temperature below the solidus temperature to a second re-solidification of the solder bumps;

wherein the first and second reflow and the first and second re-solidification steps are conducted as a continuous process in the oven without exposing the die-substrate assembly to an oxidizing atmosphere.

9. The solder bump reflow process of claim 8, wherein the first cooling temperature ranges between the solidus temperature and about 50° C. less than the solidus temperature.

10. The solder bump reflow process of claim 8, wherein the material of the solder bumps includes lead solder.

11. The solder bump reflow process of claim 8, wherein the material of the solder bumps includes lead-free solder.

12. The solder bump reflow process of claim 8, wherein the material of the solder bumps includes tin-lead solder.

13. The solder bump reflow process of claim 8, wherein the solder bump material is 63% tin and 37% lead eutectic.

14. The solder bump reflow process of claim 8, wherein the first heating temperature is above 183° C. and the first cooling temperature is between 183° C. and 133° C.

15. The solder bump reflow process of claim 8, wherein a number of the solder bumps on the die fail to metallurgically connect to the mating surfaces of the interconnect sites on the substrate during the first reflow and first re-solidification.

16. The solder bump reflow process of claim 15, wherein the number of the solder bumps which failed to metallurgically connect to the mating surfaces of the interconnect sites on the substrate during the first reflow and first re-solidification are metallurgically connected during the second reflow and second re-solidification.

17. A solder bump reflow process, comprising:
providing a die having a plurality of solder bumps and a substrate having a plurality of mating surfaces on interconnect sites, the solder bumps being made with a material having a liquidus temperature and a solidus temperature;

contacting the solder bumps of the die and the mating surfaces of the substrate to form a die-substrate assembly; and passing the die-substrate assembly through an oven operating in a non-oxidizing atmosphere, including the steps of, (a) raising the die-substrate assembly to a first heating temperature above the liquidus temperature of the solder bumps, and holding the first heating temperature above the liquidus temperature to cause a first reflow of the solder bumps onto the mating surfaces of rhe substrate, (b) decreasing the die-substrate assembly to a first cooling temperature below the solidus temperature of the solder bumps, and holding the first cooling temperature below the solidus temperature to a first re-solidification of the solder bumps, (c) raising the die-substrate assembly to a second heating temperature above the liquidus temperature of the solder bumps, and holding the second heating temperature above the liquidus temperature to cause a second reflow of the solder bumps onto the mating surfaces of the substrate, and (d) decreasing the die-substrate assembly to a second cooling temperature below the solidus temperature to a second re-solidification of the solder bumps;

wherein the first and second reflow and the first and second re-solidification steps are conducted without exposing the assembly to an oxidizing atmosphere.

18. The solder bump reflow process of claim 17, wherein a number of the solder bumps on the die fail to metallurgically connect to the mating surfaces of the interconnect sites on the substrate during the first reflow and first re-solidification.

19. The sdlder bump reflow process of claim 18, wherein the number of the solder bumps which failed to metallurgically connect to the mating surfaces of the interconnect sites on the substrate during the first reflow and first re-solidification are metallurgically connected during the second reflow and second re-solidification.

20. The solder bump reflow process of claim 17, wherein the first cooling temperature ranges between the solidus temperature and about 50° C. less than the solidus temperature.

21. The solder bump reflow process of claim 17, wherein the material of the solder bumps includes lead solder.

22. The solder bump reflow process of claim 17, wherein the material of the solder bumps includes leadfree solder.

23. The solder bump reflow process of claim 17, wherein the material of the solder bumps includes tin-lead solder.

24. The solder bump reflow process of claim 17, wherein the solder bump material is 63% tin and 37% lead eutectic.

25. The solder bump reflow process of claim 17, wherein the first heating temperature is above 183° C. and the first cooling temperature is between 183° C. and 133° C.

* * * * *

UNITED STATES PATENT AND TRADEMARK OFFICE
CERTIFICATE OF CORRECTION

PATENT NO. : 7,367,489 B2
APPLICATION NO. : 10/882078
DATED : May 6, 2008
INVENTOR(S) : Rajendra D. Pendse It is certified that error appears in the above-identified patent and that said Letters Patent is hereby corrected as shown below:

Column 10, line 42, please delete the "." after "50° C"

Column 10, line 52, please delete the extra "°" symbol after 183°, and delete the "." after "C"

Column 10, line 53, please delete the "." after the first "C"

Column 11, line 16, please delete the word "liguidus" and replace with the word -- liquidus --

Column 11, line 29, please delete the "." after "C"

Column 11, line 39, please delete the "." after "C"

Column 11, line 40, please delete the "." after the first "C"

Column 12, line 35, please delete the word "sdlder" and replace with the word -- solder --

Column 12, line 43, please delete the "." after "C"

Column 12, line 48, please delete the word "leadfree" and replace with the word -- lead-free --

Column 12, line 54, please delete the "." after "C"

UNITED STATES PATENT AND TRADEMARK OFFICE
CERTIFICATE OF CORRECTION

PATENT NO. : 7,367,489 B2
APPLICATION NO. : 10/882078
DATED : May 6, 2008
INVENTOR(S) : Rajendra D. Pendse It is certified that error appears in the above-identified patent and that said Letters Patent is hereby corrected as shown below:

Column 12, line 45, please delete the "." after the first "C"

Signed and Sealed this

Twenty-second Day of July, 2008

JON W. DUDAS
*Director of the United States Patent and Trademark Office*